(12) United States Patent
Owerfeldt

(10) Patent No.: US 7,109,892 B2
(45) Date of Patent: Sep. 19, 2006

(54) DEVICE FOR ACTIVATING AN ELECTRONIC CONTROL UNIT

(75) Inventor: Andre Owerfeldt, Markgroeningen (DE)

(73) Assignee: Robert Bosch GmbH, Stuttgart (DE)

( * ) Notice: Subject to any disclaimer, the term of this patent is extended or adjusted under 35 U.S.C. 154(b) by 633 days.

(21) Appl. No.: 10/129,684

(22) PCT Filed: Aug. 29, 2001

(86) PCT No.: PCT/DE01/03302

§ 371 (c)(1),
(2), (4) Date: Aug. 6, 2002

(87) PCT Pub. No.: WO02/21223

PCT Pub. Date: Mar. 14, 2002

(65) Prior Publication Data

US 2003/0015920 A1    Jan. 23, 2003

(30) Foreign Application Priority Data

Sep. 7, 2000    (DE) .............................. 100 44 087

(51) Int. Cl.
H03K 17/94    (2006.01)
H03M 11/00    (2006.01)

(52) U.S. Cl. ..................... 341/22; 341/26; 341/20; 340/825.78

(58) Field of Classification Search .......... 341/20, 341/22, 26
See application file for complete search history.

(56) References Cited

U.S. PATENT DOCUMENTS 4,016,483 A * 4/1977 Rudin .................... 323/354
4,580,138 A * 4/1986 Morrison ............... 340/825.78
4,583,189 A * 4/1986 Koyama ................... 708/142
4,651,138 A * 3/1987 Morrison ................. 340/510
4,817,010 A * 3/1989 Dobbins .................. 700/232
4,872,008 A * 10/1989 Ohtsuka et al. ............ 341/26
4,884,070 A * 11/1989 Hannaford ............ 340/825.78
4,918,634 A * 4/1990 Nishimori ................. 708/142
5,146,172 A * 9/1992 Mehr-Ayin et al. ......... 324/691
5,424,731 A * 6/1995 Kronberg ................... 341/26
5,521,575 A * 5/1996 Pack ......................... 341/26
5,699,857 A * 12/1997 Flaishans et al. .......... 165/202
5,939,998 A * 8/1999 Caporuscio et al. ........ 340/3.4
6,178,388 B1 * 1/2001 Claxton ................... 702/107
6,639,523 B1 * 10/2003 Kaikuranta et al. ......... 341/22
6,970,752 B1 * 11/2005 Lim et al. .................. 700/94

FOREIGN PATENT DOCUMENTS

| DE | 39 07 432 | 9/1990 |
|----|-----------|--------|
| EP | 0 577 567 | 1/1994 |
| FR | 2 653 279 | 4/1991 |

OTHER PUBLICATIONS

*Simple Multiplexing Hand-Held Control Unit*, NTIS Tech Notes, U.S. Dept. of Commerce, Springfield, VA, Mar. 1, 1990, p. 231.

* cited by examiner

Primary Examiner—Rexford Barnie
Assistant Examiner—Nguyen Khai
(74) Attorney, Agent, or Firm—Kenyon & Kenyon LLP

(57) ABSTRACT

A device for activating a control unit is proposed. It includes at least one operating element operable by a user as well as analog encoding means assigned to the operating element. To generate an activation signal for a control unit, deactivation means are provided that deactivate at least one analog encoding means in order to digitally encode the operating element.

9 Claims, 2 Drawing Sheets

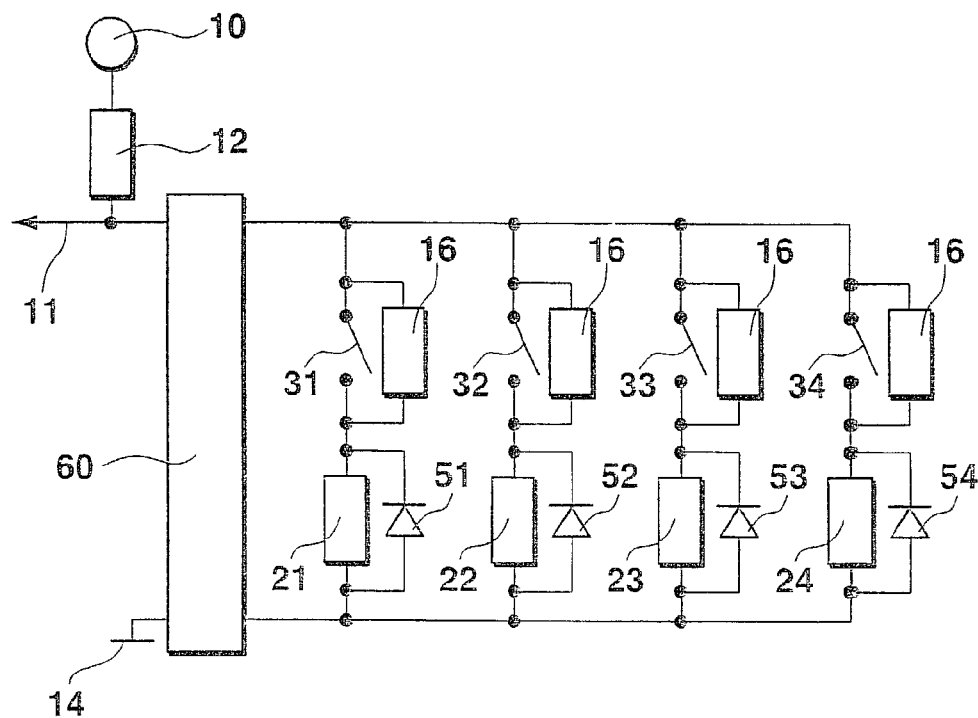
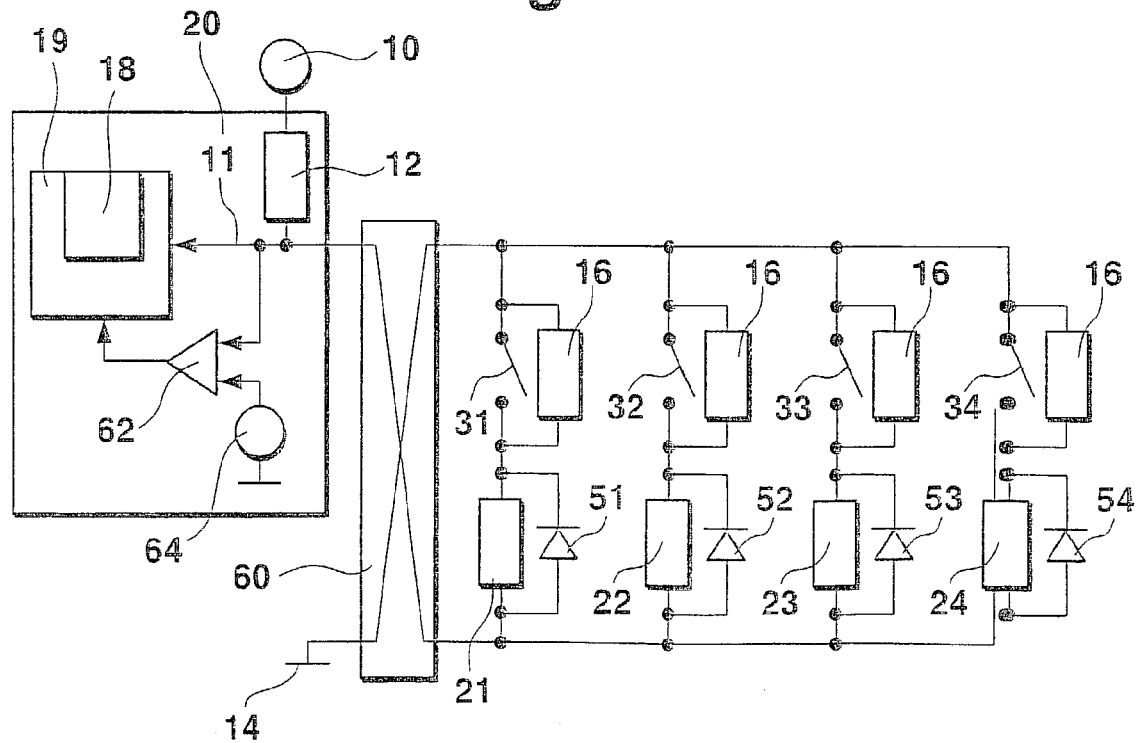

DEVICE FOR ACTIVATING AN ELECTRONIC CONTROL UNIT

FIELD OF THE INVENTION

The present invention a device for activating a control unit according to the species defined in the independent claim. In automotive engineering, a plurality of operating elements are input in an analog manner in order to eliminate lines in a motor vehicle. In this context, depending on the control state of the operating elements, different voltages are generated at an analog input in that resistors different from the one used in the control unit are connected in series with the corresponding operating element. The resistor in the control unit and the resistor activated by the appropriate operating element form a voltage divider. The instantaneous state of the circuit elements and of the corresponding operating elements is able to be determined on the basis of the thus-established voltage. When one of the operating elements is operated, the activation operation of a control unit in rest mode is able to be introduced in order to power up the control unit.

BACKGROUND INFORMATION

If this operating element is encoded in an analog manner, an operating instance of the operating element would be able to be detected by a comparator or with the help of an analog-digital converter and a series-connected microcontroller. In the latter case, the microcontroller would either need to be permanently switched on for the voltage evaluation or regularly activated. This is associated with significant additional expenditure. However, if an operation is detected in connection with a comparator, the problem arises that voltage fluctuations, structural component tolerances, climatic influences, or also ageing or contamination cause the input level to shift so significantly that clear detection of a signal change is not able to be ensured over the entire lifetime. In particular, contamination of the operating element that is expressed, for example, in a parasitic resistor in parallel with the actual circuit element leads to problems regarding reliable operation detection. Therefore, an object of the present invention is to reliably detect operation of an analog encoded operating element in order to activate a control unit.

SUMMARY OF THE INVENTION

The device for activating a control unit of the present invention has at least one operating element able to be operated by a user. At least one analog encoding means is assigned to this operating element in order to detect operation of the operating element. In accordance with the present invention, deactivation means, which deactivate the analog encoding means and instead digitally, preferably binarily encode the operating element, are provided for generating an activation signal for a control unit Due to the clear, digital evaluation, operation of the operating element is able to be reliably detected even if different voltage levels or ageing processes significantly influence a signal encoded in an analog manner. Therefore, in particular, a comparator that compares the output signal influenced by the operating element with a fixed limiting value may be used for the evaluation. As a result of dispensing with a microcontroller for evaluating the signals, the need for closed-circuit current is able to be reduced.

In an advantageous further refinement, an electrical resistor is provided as the analog encoding means, a circuit element or a diode being connected in parallel thereto for its deactivation. If the control unit is in the normal mode, the operating elements are encoded in an analog manner. However, in the rest state of the control unit, the circuit element or the diode, being polarized in the forward direction, short-circuits the appropriate resistor or bridges it in a low-resistance manner. Due to the significantly reduced voltage drop, any operation of the operating element is able to be reliably detected. Not all analog encoding means have to be deactivated. For example, it could be provided for only the high-resistance resistors to be short-circuited. As such, it is ensured that when the operating element is operated, a sufficiently high voltage level is available for further evaluation for a possible activation of the control unit.

In an advantageous further refinement, a polarity-reversal means is provided for the purpose of deactivating the analog encoding means, the polarity-reversal means reversing the polarity of the diode in the rest state of the control unit in the forward direction, so that the appropriate analog encoding means is deactivated or short-circuited. In particular in the case of a plurality of operating elements connected in parallel, it may be achieved in a particularly simple manner that all analog encoding means are deactivated by simply reversing the polarity of the connection points. During normal operation of the control unit, the polarity-reversal means switch the diodes back to the blocking mode, so that the analog encoding is activated again.

BRIEF DESCRIPTION OF THE DRAWINGS

FIG. 3 shows a first illustration of a second exemplary embodiment, once during normal operation of the control unit and once in the rest mode of the control unit.
FIG. 4 shows a second illustration of the second exemplary embodiment, once during normal operation of the control unit and once in the rest mode of the control unit.

DETAILED DESCRIPTION

Figure 1:
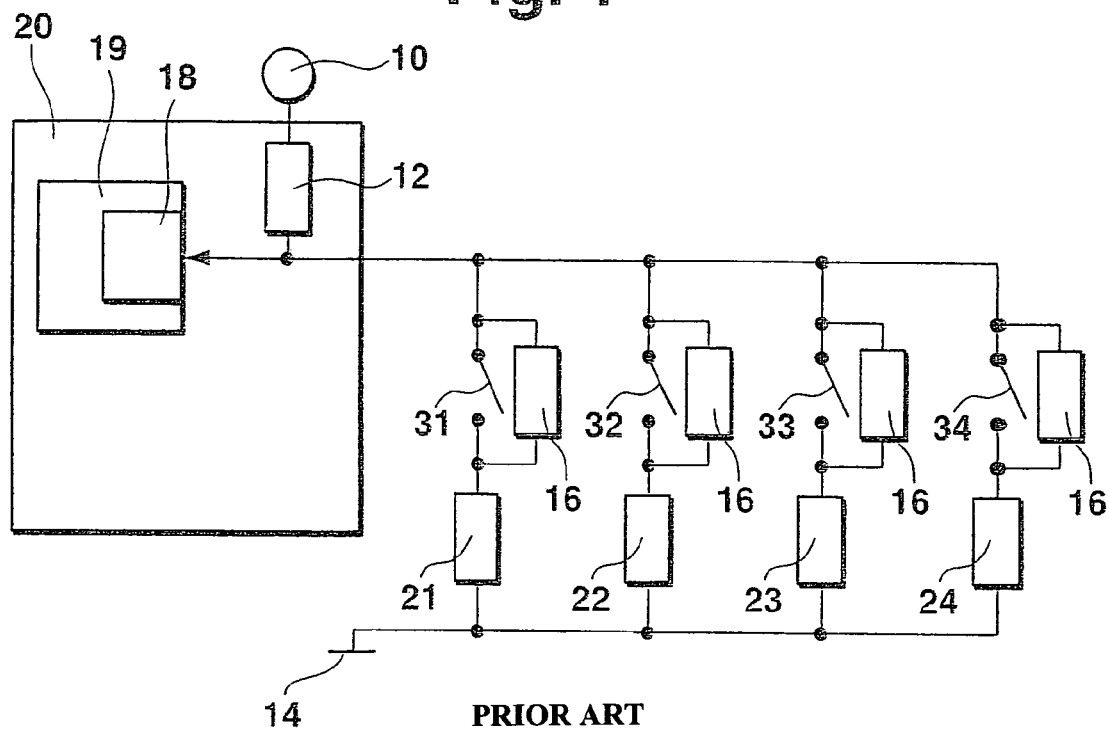
FIG. 1 shows a device according to the related art.

FIG. 1 describes a device according to the related art. The four operating elements 31 through 34 shown by way of example are encoded in an analog manner by series resistors 21 through 24, respectively. The series connection of first operating element 31 and first resistor 21, second operating element 32 and second resistor 22, third operating element 33 and third resistor 23, and fourth operating element 34 and fourth resistor 24 is connected in parallel. The one connection is at ground 14. The second connection is set to a positive potential 10 across a resistor 12. It is also directed via an analog/digital converter 18 to a microcontroller 19 for further processing. Analog/digital converter 18, microcontroller 19, as well as resistor 12 are part of control unit 20. Control unit 20 may be operated in a normal mode and in a rest mode. The rest mode is distinguished, for example, by a limited operating method that consequently necessitates little or no current. A contamination of operating elements 31 through 34 may result in a parasitic shunt resistor 16, which appears, for example, at all operating elements 31 through 34.

Figure 2:
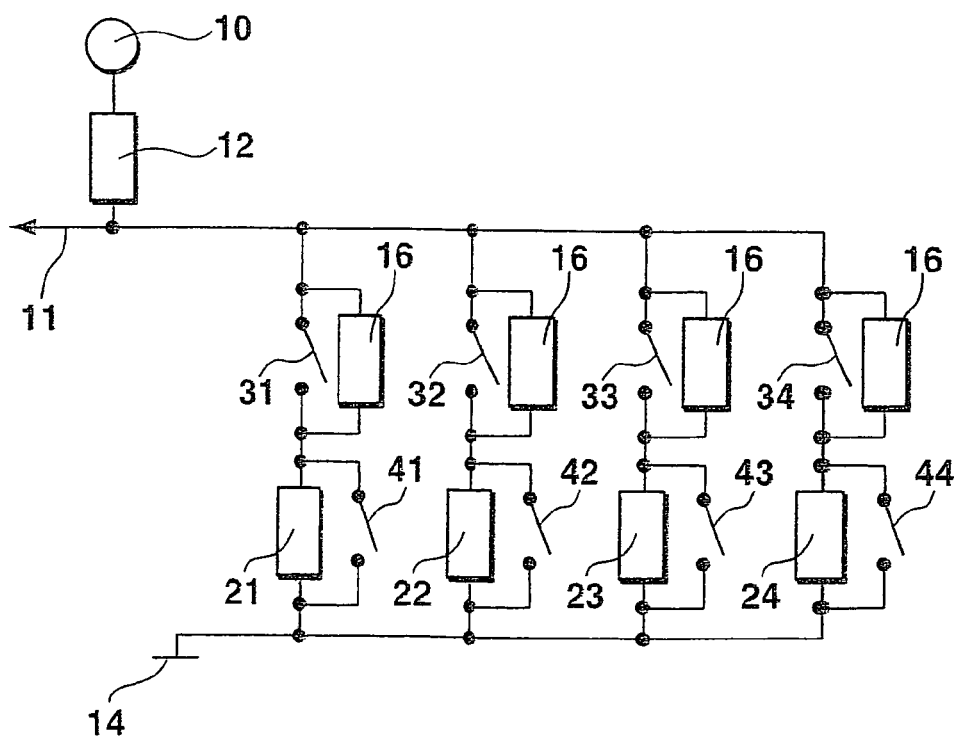
FIG. 2 shows a first exemplary embodiment.

In the exemplary embodiment according to FIG. 2, circuit elements 41 through 44 are provided as deactivating means for analog encoding means 21 through 24. Therefore, first circuit element 41 is connected in parallel with first resistor 21, second circuit element 42 is connected in parallel with second resistor 22, and so on. Otherwise, the configuration corresponds to that of FIG. 1.

In the exemplary embodiment according to FIGS. 3 and 4, diodes 51 through 54 are provided as the deactivation means. First diode 51 is connected in parallel with first resistor 21, second diode 52 is connected in parallel with resistor 22, and so on. In FIG. 3, diodes 51 through 54 are polarized in the blocking direction. As such, no current flows through diodes 51 through 54, so that analog encoding means 21 through 24 are activated. Such a polarity reversal is provided during normal operation of control unit 20. For this purpose, appropriate polarity-reversal means are situated between the connections and ground 14 and positive potential 10, respectively. An output signal 11 reaches an analog input of control unit 20 that is not shown in greater detail.

The exemplary embodiment in FIG. 4 differs from that in FIG. 3 only in that polarity-reversal means 60 reverse the polarity of diodes 51 through 54 in the manner that they are then operated in the forward direction. Therefore, they are used as deactivation means for analog encoding means 21 through 24. The current no longer flows across resistors 21 through 24 but across diodes 51 through 54. This operating mode is provided for the rest mode of control unit 20. Output signal 11 reaches a comparator 62, which as a function of the comparison to a reference voltage 64, generates a binary output signal for microcontroller 19 to activate the microcontroller.

In the related art (FIG. 1), analog resistor encoding is shown for a plurality of operating elements 31 through 34. In order to eliminate lead wires to the control unit 20 to be evaluated, operating elements 31 through 34 are connected in parallel with series resistors 21 through 24, respectively. The resistance values of resistors 21 through 24 are selected differently in each case. As a result, when the user operates a certain operating element 31 through 34, a voltage level characteristic for this operating element 31 through 34 is reached via the voltage divider that is formed from resistor 12 and resistors 21 through 24 activated in each case. This characteristic voltage level is provided to analog/digital converter 18 as an analog value. After the analog value is digitalized, microcontroller 19 is able to detect, for example by comparison with characteristic voltage levels, which of the operating element(s) 31 through 34 was/were operated. Corresponding functional sequences are initiated as a function of the operation. This described functionality occurs during normal operation of control unit 20.

Parasitic shunt resistors 16 may occur due to ageing processes, for example. Since microcontroller 19 ensures a high degree of flexibility, ageing operations and voltage levels shifting as a result are able to be learned for the standard operation. However in the rest mode of control unit 20, microcontroller 19 is to be deactivated in order to lower the need for closed-circuit current. Then other reliable evaluation methods for detecting operation of an operating element 31 through 34 are performed in order to activate control unit 20 in the case of operation of an operating element 31 through 34, i.e., to bring it from the rest mode into normal operation. This is described in connection with FIGS. 2 through 4.

As seen in FIG. 2, circuit elements 41 through 44 are provided as deactivation means that are connected in parallel with respective resistor 21 through 24. During normal operation of control unit 20, the circuit elements are open, so that the functionality of an analog encoding of operating elements 31 through 34 already discussed in connection with FIG. 1 is achieved. However, if control unit 20 is in the rest mode, circuit elements 41 through 44 are closed. As a result, analog encoding means 21 through 24 are short-circuited for their deactivation. At this point, operating elements 31 through 34 are encoded binarily. Due to the deactivation of the analog encoding means, the voltage change increases when an operating element 31 through 34 is operated to a greater extent than would be the case if analog encoding means 21 through 24 were still active. By suitably selecting reference voltage 64, which establishes the comparator switching threshold, an operation of an operating element 31 through 34 is detected with a high degree of reliability.

Only an opening or a closing of any operating element is apparent from output signal 11. Output signal 11 may, for example, be compared by comparator 62 to a reference voltage 64. Reference voltage 64 is selected such that when any one of operating elements 31 through 34 is operated, the reference voltage is reliably exceeded. The output signal of comparator 62 changes its state when any operating element 31 through 34 is operated, thereby activating microcontroller 19 and, consequently, control unit 20. For example, a door handle contact of a motor vehicle could be provided as operating element 31 through 34. Therefore, control unit 20 is already activated when the door handle is operated. As such, the powering-up operation of control unit 20 is already able to be successfully completed when the driver wishes to start the vehicle. Any other sufficiently known operating elements may also be evaluated in the manner described.

In the exemplary embodiment according to FIGS. 3 and 4, diodes 51 through 54 are provided as the deactivation means. They essentially satisfy the same conditions as circuit elements 41 through 44 in FIG. 2. In FIG. 3, diodes 51 through 54 are polarized in the blocking direction, so that the desired analog encoding is available during normal operation of control unit 20. However, if control unit 20 is in the rest mode, diodes 51 through 54 are polarized in the forward direction. As such, they bridge resistors 21 through 24 to deactivate them. This is achieved by polarity-reversal means 60. The polarity-reversal means could, for example, have corresponding circuit elements in order to ensure the desired polarity reversal. A bridge connection made up of four additional circuit elements is suitable for this. Polarity-reversal means 60 are able to be integrated in control unit 20.

Microcontroller 19 is able to control the deactivation or activation of the analog encoding as a function of a command signal on the basis of which control unit 20 enters the rest state. The signal "ignition on/off" is also suitable for this purpose. If the vehicle is turned off via the signal "ignition off," the deactivation of the analog encoding is able to be triggered by this signal. At the latest when the signal "ignition on" occurs the analog encoding is again permitted.

It is not absolutely necessary for every resistor 21 through 24 to be short-circuited. However, it is particularly advantageous when resistors 21 through 24 are relatively high-resistance in comparison with the contaminant resistors/capacitive shunt resistors 16.

Although as a result of the indicated configuration, the evaluation is preferably able to be performed by a comparator 62, an analog/digital converter 18 having a series-connected microcontroller 19 is also conceivable. The evaluation reliability is also increased in this case.

What is claimed is:

1. A device for activating a control unit, comprising:
   at least one operating element operable by a user;
   at least one analog encoding arrangement assigned to the at least one operating element in order to detect an operation of the at least one operating element;

a deactivation arrangement for deactivating the at least one analog encoding arrangement in order to digitally encode the at least one operating element and for generating an activation signal for the control unit, wherein the at least one analog encoding arrangement is deactivated in a rest mode of the control unit.

2. The device as recited in claim 1, wherein the at least one analog encoding arrangement includes an electrical resistor.

3. The device as recited in claim 1 wherein the at least one analog encoding arrangement is deactivated by being one of short-circuited and bridged in a low-resistance manner.

4. The device as recited in claim 1, further comprising at least one of:
   at least one circuit element connected in parallel with the at least one analog encoding arrangement; and
   at least one diode for deactivating the at least one analog encoding arrangement.

5. The device as recited in claim 1, wherein at least two of the at least one operating element are provided with at least two different analog encoding arrangements, and wherein the two analog encoding arrangements differ with respect to one of analog values and resistance values.

6. A device for activating a control unit, comprising:
   at least one operating element operable by a user;
   at least one analog encoding arrangement assigned to the at least one operating element in order to detect an operation of the at least one operating element;
   a deactivation arrangement for deactivating the at least one analog encoding arrangement in order to digitally encode the at least one operating element and for generating an activation signal for the control unit; and
   a polarity-reversal arrangement for polarizing at least one diode in a forward direction and for deactivating the at least one analog encoding arrangement.

7. A device for activating a control unit, comprising:
   at least one operating element operable by a user;
   at least one analog encoding arrangement assigned to the at least one operating element in order to detect an operation of the at least one operating element; and
   a deactivation arrangement for deactivating the at least one analog encoding arrangement in order to digitally encode the at least one operating element and for generating an activation signal for the control unit, wherein at least one output signal of the at least one analog encoding arrangement is supplied to a comparator in order to activate the control unit.

8. The device as recited in claim 7, wherein an activation occurs when a limiting value is one of exceeded and not met by the at least one output signal.

9. A device for activating a control unit, comprising:
   at least one operating element operable by a user;
   at least one analog encoding arrangement assigned to the at least one operating element in order to detect an operation of the at least one operating element;
   a deactivation arrangement for deactivating the at least one analog encoding arrangement in order to digitally encode the at least one operating element and for generating an activation signal for the control unit, wherein the at least one analog encoding arrangement is deactivated as a function of an ignition on/off signal of a motor vehicle.

* * * * *